(12) United States Patent
Darringer et al.

(10) Patent No.: US 8,112,727 B2
(45) Date of Patent: *Feb. 7, 2012

(54) METHOD AND SYSTEM PRODUCT FOR IMPLEMENTING UNCERTAINTY IN INTEGRATED CIRCUIT DESIGNS WITH PROGRAMMABLE LOGIC

(75) Inventors: John A Darringer, Mahopac, NY (US); George W Doerre, Poughkeepsie, NY (US); Victor N Kravets, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 717 days.

This patent is subject to a terminal disclaimer.

(21) Appl. No.: 12/137,628

(22) Filed: Jun. 12, 2008

(65) Prior Publication Data

US 2008/0250362 A1  Oct. 9, 2008

Related U.S. Application Data

(60) Continuation of application No. 11/553,076, filed on Oct. 26, 2006, now Pat. No. 7,493,586, which is a division of application No. 10/714,750, filed on Nov. 17, 2003, now Pat. No. 7,131,098.

(51) Int. Cl.
*G06F 17/50* (2006.01)
(52) U.S. Cl. ........ 716/100; 716/101; 716/104; 716/116; 716/117
(58) Field of Classification Search .......... 716/100–104, 716/116–117
See application file for complete search history.

(56) References Cited

U.S. PATENT DOCUMENTS

| 5,822,760 | A | 10/1998 | Yoshizawa et al. ........... 711/137 |
| 6,148,436 | A | 11/2000 | Wohl ............................... 716/18 |
| 6,216,252 | B1 * | 4/2001 | Dangelo et al. ............... 716/102 |
| 6,216,257 | B1 * | 4/2001 | Agrawal et al. ................. 326/41 |
| 6,226,777 | B1 | 5/2001 | Zhang ............................... 716/5 |
| 6,240,376 | B1 | 5/2001 | Raynaud et al. ................ 703/15 |
| 6,256,770 | B1 | 7/2001 | Pierce et al. .................... 716/18 |
| 6,618,841 | B1 | 9/2003 | Huang ............................. 716/4 |
| 7,574,334 | B2 * | 8/2009 | Tiwari et al. ..................... 703/2 |
| 2004/0034843 | A1 * | 2/2004 | Osann, Jr. ....................... 716/16 |
| 2004/0133869 | A1 * | 7/2004 | Sharma .......................... 716/16 |
| 2004/0230934 | A1 | 11/2004 | Taylor et al. .................... 716/17 |

* cited by examiner

*Primary Examiner* — Paul Dinh
(74) *Attorney, Agent, or Firm* — Harrington & Smith

(57) ABSTRACT

Disclosed is a method, system and computer program product to specify an integrated circuit. The integrated circuit includes a hardwired specific logic technology portion and a programmable specific logic technology portion. The method includes generating a hybrid logic network by mapping each uncertain logic function to an abstract programmable logic element implementation thereof and by mapping each known logic function to a technology-independent logic element implementation thereof; simplifying the hybrid logic network using logic synthesis optimizations; mapping the simplified hybrid logic network to a specific technology by mapping the abstract programmable logic element implementation to the specific programmable logic technology and the technology-independent logic element implementation to the specific logic technology; and further includes optimizing the mapped network to meet performance constraints. Generating involves using integrated circuit specification language extensions that include an Uncertain Function that is used in place of a logic function or operator, an Uncertain Function Assertion for imposing at least one constraint on the Uncertain Function, an Uncertain Register for a register having a programmable size within a specified range and an Uncertain Constant.

11 Claims, 8 Drawing Sheets

FINAL IMPLEMENTATION

METHOD AND SYSTEM PRODUCT FOR IMPLEMENTING UNCERTAINTY IN INTEGRATED CIRCUIT DESIGNS WITH PROGRAMMABLE LOGIC

CROSS REFERENCE TO RELATED APPLICATION

This application is a continuation of U.S. patent application Ser. No. 11/553,076 filed Oct. 26, 2006 now U.S. Pat. No. 7,493,586, which is a divisional of U.S. patent application Ser. No. 10/714,750 filed Nov. 17, 2003 and is now issued U.S. Pat. No. 7,131,098.

TECHNICAL FIELD

This invention relates generally to techniques for designing and specifying digital logic devices, such as those containing field programmable gate arrays (FPGAs) and application specific integrated circuits (ASICs), and more specifically relates to a computer program language extension for specifying uncertainty in a logic design, and to a method of implementing a specified design in a network of programmable gate arrays as well as in standard digital logic.

BACKGROUND

Logic designers of so-called "System-on-a-Chip" and similar products have a broad range of components to select from. For example, the designer can use high performance logic gates, latches, static random access memory (SRAM) bits, register files, embedded dynamic RAM (DRAM) and embedded FPGAs to implement a product specification. In a typical ASIC embodiment selected logic gates are hardwired during chip manufacturing into a required circuit configuration, while in a FPGA embodiment selected logic gates can be programmatically configured into the required circuit configuration during system power-up, or at some other convenient time.

The use of embedded FPGAs is a relatively new development. Due to the inherent programmability of the FPGA, the use of the embedded FPGA is attractive since it provides a mechanism to deal with uncertainty in the logic specification, and it furthermore, permits some degree of customization after a digital logic-containing integrated circuit (chip), such as an ASIC, has been manufactured. However, FPGAs are typically much larger in area, and operate at a significantly slower speed, than equivalent ASIC logic. As a result, the logic designer is presented with the challenge of determining just how to use the mix of components on the chip to best realize the product specification and to also allow for changes in the product definition, while at the same time minimizing design time and cost.

Currently available hardware description languages such as Verilog (Verifying Logic, for which an IEEE standardization process is being finalized as the Verilog 1364-2000 standard), and VHDL VHSIC (Very High Speed Integrated Circuit) Hardware Description Language), another IEEE Standard, are intended for fully specifying logic design. While they do provide unknown constants, they have no direct mechanism for handling "uncertainty" or flexibility in a logic design. Typically, if a logic designer suspects that a logic function may need to be changed, one possible logic function (e.g., a best guess logic function) can be specified and implemented in an FPGA. Subsequently, after the chip is manufactured the embedded FPGA can be programmed to accommodate a change in the design specification. In effect, the logic designer must determine what functions are to be variable, and must select a set of FPGAs for implementation, without any assistance. Further, the decision as to which logic functions are to be variable is not captured in the HDL specification, and must be recorded separately.

SUMMARY OF THE PREFERRED EMBODIMENTS

The foregoing and other problems are overcome, and other advantages are realized, in accordance with the presently preferred embodiments of this invention.

An aspect of this invention is a language extension for specifying uncertainty in a design, as well as a method of implementing the specified design in a network of FPGAs and standard digital logic. The use of the language extension accurately captures the intent of the logic designer, and enables additional automation to be brought to bear on the digital logic design and specification process. The method combines the strengths of ASIC and FPGA implementation tools to provide a more efficient implementation of a hybrid or mixed ASIC/FPGA design.

An extension to existing digital logic specification languages is provided to enable the rapid and accurate description of uncertainty or flexibility that is to be provided in the integrated circuit being designed. The specification information is used during the design process to produce an efficient implementation that takes advantage of the capability of FPGAs, as well as the logic and memory elements available. An FPGA is used when it is able to meet performance constraints, otherwise an implementation is produced using another logic type or types, such as SRAM and logic elements.

The use of the extension to the existing digital logic design languages provides a logic design process that accommodates uncertainties in the specification in an essentially self-documenting manner.

Disclosed is a method, system and computer program product to specify and to implement an integrated circuit. The integrated circuit includes a hardwired specific logic technology portion and a programmable specific logic technology portion. The method includes generating a hybrid logic network by mapping each uncertain logic function to an abstract programmable logic element implementation thereof and by mapping each known logic function to a technology-independent logic element implementation thereof; and simplifying the hybrid logic network using logic synthesis optimizations; mapping the simplified hybrid logic network to a specific technology by mapping the abstract programmable logic element implementation to the specific programmable logic technology and the technology-independent logic element implementation to the specific logic technology. The preferred embodiment of the method further includes optimizing the mapped network to meet performance constraints. Generating involves using integrated circuit specification language extensions that include Uncertain constants for values that are not known until after implementation, an Uncertain Function that is used in place of a logic function or operator, an Uncertain Function Assertion for imposing at least one constraint on the Uncertain Function, and an Uncertain Register for a register having a programmable size within a specified range.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 1A depicts a 2-input, 3-output decoder having an incompletely specified logic function, FIG. 1B depicts a 2-input, 3-output decoder having an unspecified 2-input selector that selects between two fully specified decoders, and FIG. 1C depicts a 2-input, 3-output decoder with an unspecified function of two inputs and an uncertain constant that select between two fully specified decoders that each use a register of uncertain length;

DETAILED DESCRIPTION OF THE PREFERRED EMBODIMENTS

An aspect of this invention provides extensions to any register-transfer-level or gate-level description language, including both Verilog and VHDL. These extensions are described as follows.

Uncertain Constant

A hardware design implementation may depend on a parameter or constant that is not known at design time. In this case the designer may use an Uncertain Constant in place of the unknown parameter in the specification. An actual constant value is then supplied after manufacture during a bring-up step (see FIGS. 7 and 8, described below). An uncertain constant has a specified maximum size, e.g., a maximum number of number of bits.

Uncertain Function

When a chip logic designer is not certain about a particular logic function, or expects that it may change, the designer may use an Uncertain Function in place of any conventional (Boolean) logic function or operator. The presently preferred Uncertain Function has two forms:

1) an incompletely specified Boolean logic function with multiple inputs and multiple outputs; inputs may include uncertain constants and all inputs and outputs must have a specified maximum size; and 2) a selectable Boolean logic function, where an uncertain value is used to select one of a set of fully specified logic functions. The uncertain value may be an uncertain constant, the output of an uncertain function or the output of an uncertain selectable function.

Uncertain Register

The chip logic designer may be uncertain about the required size of a register, and wish to change the register's size (number of bits) after manufacture of the chip. To permit this to occur an Uncertain Register statement is provided that allows a register of any size within a specified range.

Uncertain Function Assertion

To permit a more precise description of the uncertainty of flexibility to be provided after manufacture, any uncertain function may have a set of associated Assertions. The Uncertain Function Assertions allow the following types of constraints:

1) Input Assertions that use a Boolean expression to specify constraints on input values;
2) Output Assertions that use a Boolean expression to specify constraints on output values;
3) Input/Output Assertions that use a Boolean expression to specify constraints on the relation of input and output values; and
4) Dependency Assertions that permit the designer to specify which inputs determine which outputs.

Figure 5:
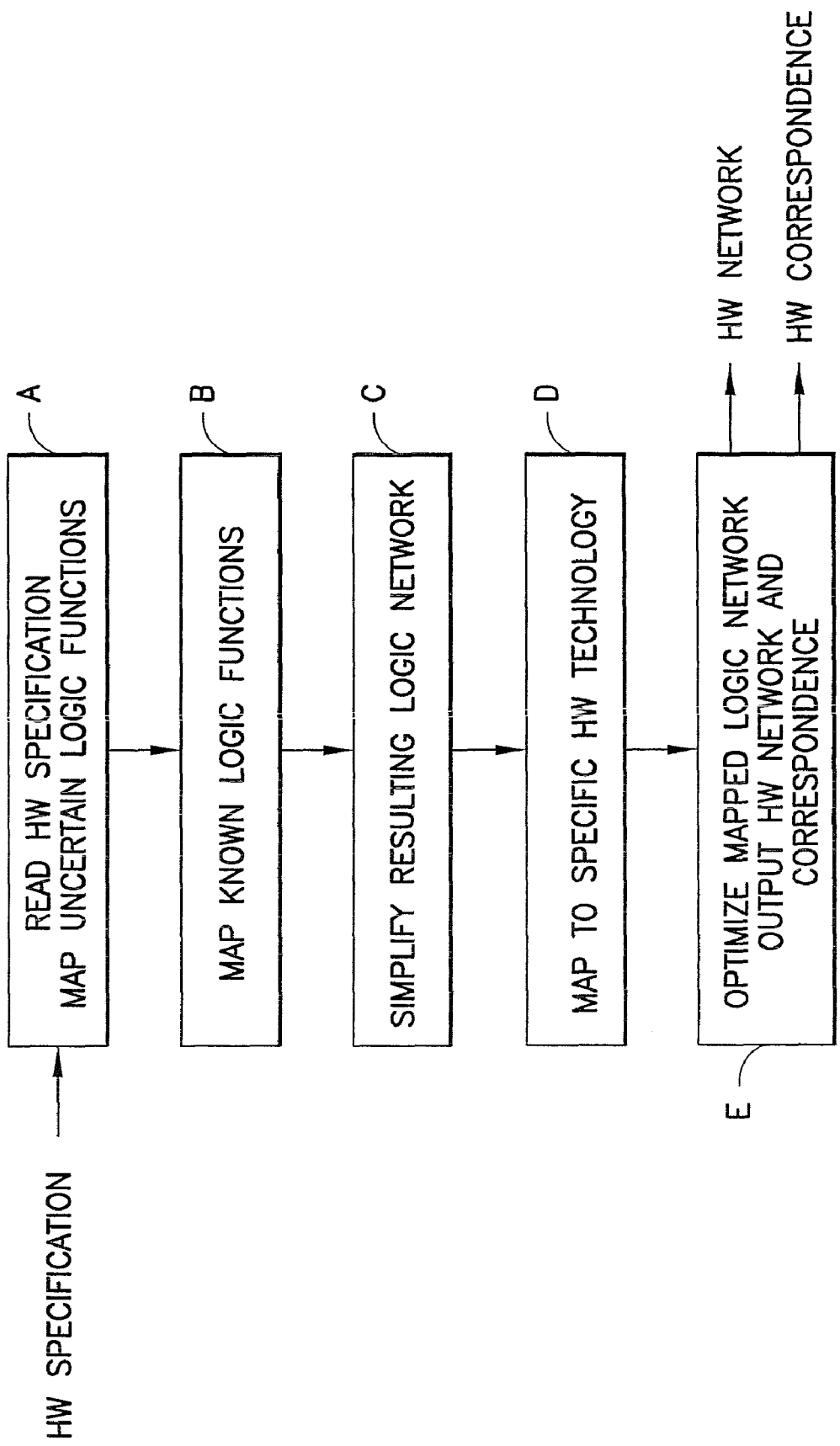
FIG. 5 is a logic flow diagram that depicts a presently preferred method in accordance with this invention.

The mapping of the input specification, including any Uncertain Constants, Functions, Registers and Assertions, into a technology-specific chip implementation is described below, and is shown in FIG. 5, as occurring in five steps (A-E). The treatment of uncertain logic can be performed separately or together with the processing of the remaining logic to allow for synergistic simplifications across the two domains.

Uncertain Logic Synthesis

Step A: Read the hardware specification and map each uncertain logic function to an abstract FPGA implementation with the specified inputs, and allocate an estimated number of FPGA blocks for the number of inputs and outputs. This involves replacing each uncertain constant with the appropriate number of FPGA outputs to provide the required values after implementation, replacing each uncertain logic function with an abstract FPGA, replacing each uncertain selector function with an abstract FPGA selector, and replacing each uncertain register with an FPGA register implementation of the required size.

Step B: Map each of the known logic functions to standard technology-independent logic elements using known logic synthesis methods.

Step C: Simplify the network obtained in Step B using known logic synthesis optimizations in accordance with the following assertions:

Input, Output and Input/Output assertions that introduce constraints that reduce the complexity of the specified target implementation, reducing the estimated number of min-terms required in an FPGA, or simplifying the logic in a multiplexer or parametric logic network (these assertions can also be used to simplify the standard logic in the network); and Dependency assertions that eliminate inputs from selected outputs and also simplify the target implementations.

Step D: This step maps the implementation to a specific technology. For example, the abstract FPGA components are mapped to sections of the specific FPGA technology provided and the standard technology-independent components are mapped to the specific logic technology provided.

Step E: Optimize the network to meet performance constraints. For example, the design specification may contain performance constraints in the form of asserted arrival times for primary inputs, required departure times for outputs and latch-to-latch times specified by clock signal constraints. Traditional timing correction methods in logic synthesis are extended with timing models for the specific FPGA technology to be used, and a set of transformations designed for trading circuit area for performance. If these heuristics are not sufficient to transform the network to meet the required performance constraints, then selected FPGA sections are replaced by a network of logic, with SRAM bits used for function selection. At the end of this step, the resulting hardware network is output along with a hardware correspondence, which indicates where each uncertain entity is located in the resulting hardware network. This correspondence is used to load actual values for the uncertain entities at bring-up time after manufacture.

Uncertain Synthesis Example

Figure 1:
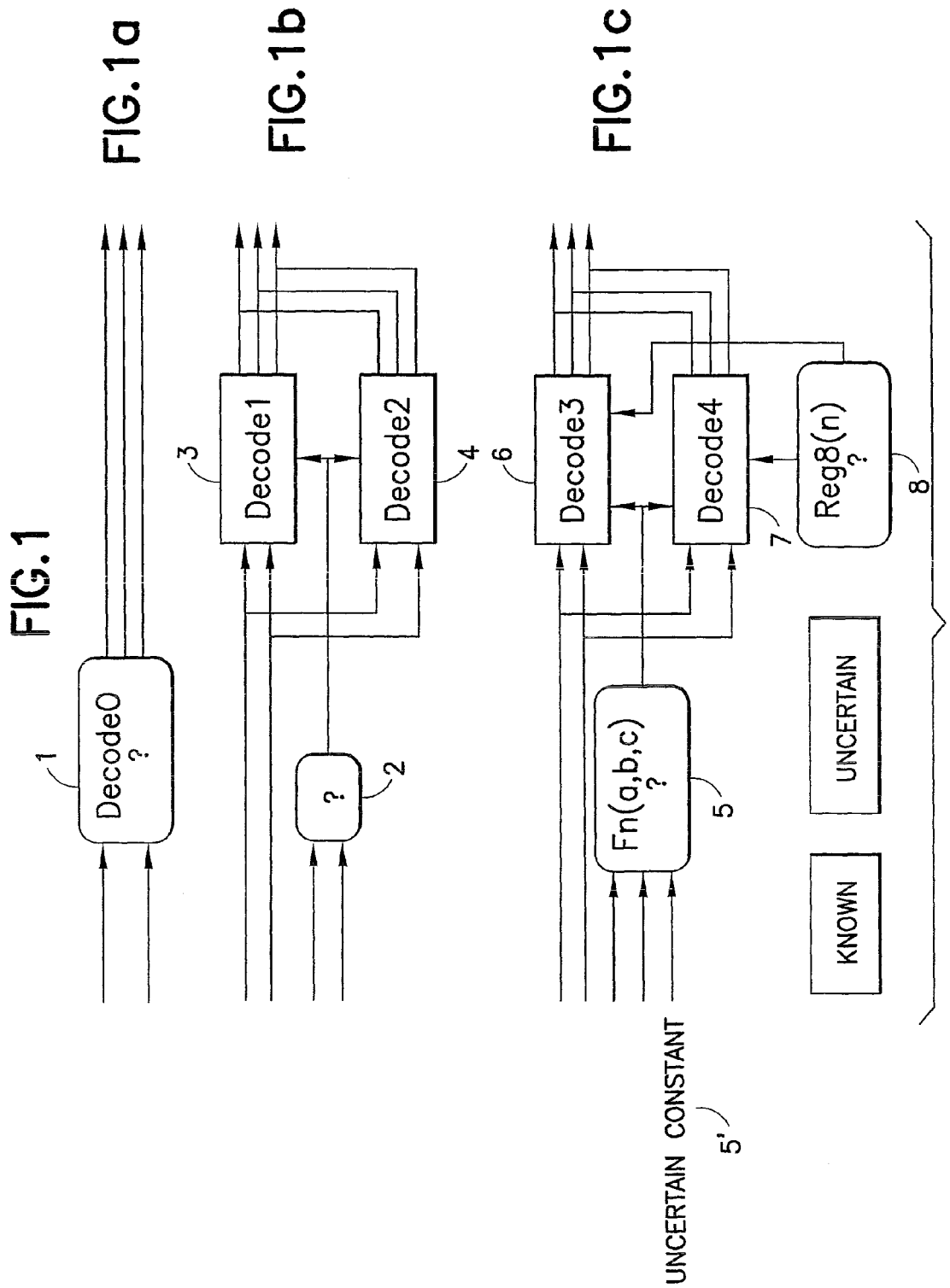
FIGS. 1A-1C, collectively referred to as FIG. 1, illustrate the use of uncertain functions in specifying a logic design, where

FIG. 1 illustrates the use of uncertain functions in specifying a design. FIG. 1A shows a 2-input, 3-output decoder 1 with a incompletely specified logic function. FIG. 1B shows a 2-input, 3-output decoder with an unspecified 2-input selector 2 that chooses between two fully specified decoders 3, 4. FIG. 1C shows a 2-input, 3-output decoder with a unspecified function 5 of two inputs and an uncertain constant 5' input that selects between two fully specified decoders 6, 7. Each decoder 6, 7 uses a register 8 of uncertain length less than or equal to 8-bits (designated Reg8($n$)).

Figure 2:
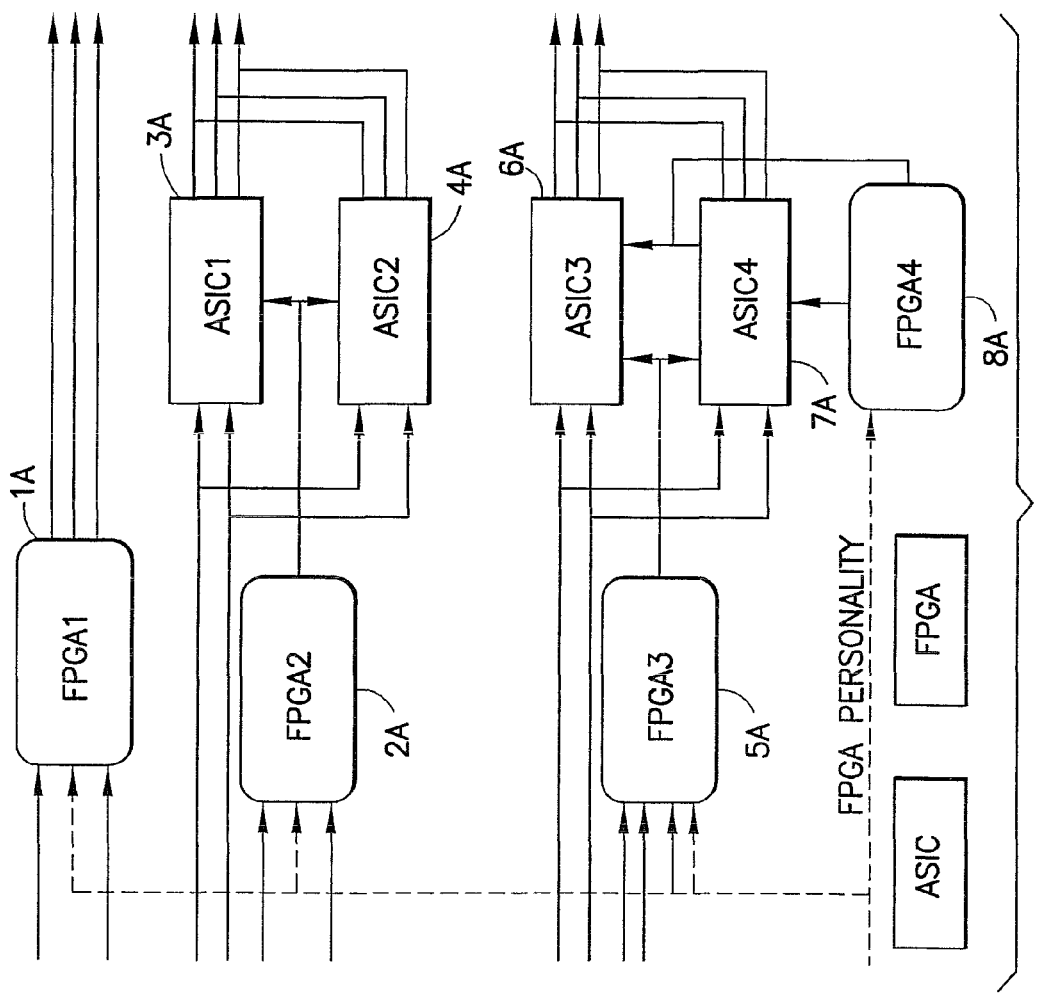
FIGS. 2A-2C, collectively referred to as FIG. 2, show a result of the completion of the initial two steps of the implementation process, based on the embodiments shown in FIGS. 1A-1C, respectively, in accordance with this invention.

FIG. 2 shows the result of the execution of Steps A and B of the implementation method shown in FIG. 5. The first decoder 1, Decode0 in FIG. 1A is mapped to an FPGA1 implementation (designated as 1A) in FIG. 2A. In the second network of FIG. 1B, the uncertain selector 2 is mapped to an abstract FPGA2 (designated as 2A), while the two standard (and known) decoders, Decode1 and Decode2, are mapped to a technology-independent logic implementation (ASIC1 3A and ASCI2 4A), as shown in FIG. 2B. The 3-input function 5, its uncertain constant input 5', and register 8 of FIG. 1C are mapped to abstract sections (FPGA3 5A and FPGA4 8A, respectively), while the two standard decoders, Decode3 and Decode4, are mapped to a technology-independent logic implementation (ASIC3 6A and ASIC4 7A), as is shown in FIG. 2C.

Figure 3:
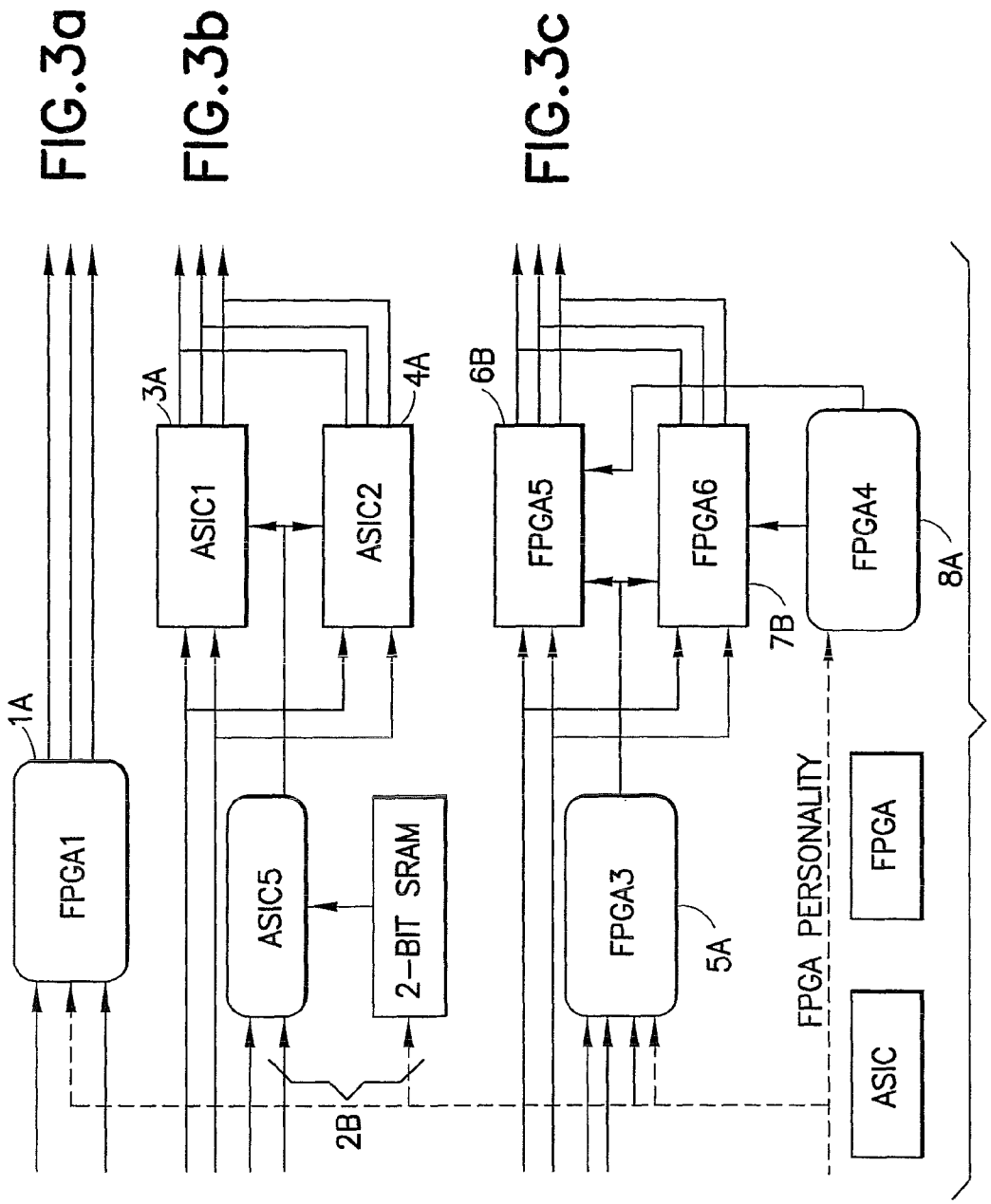
FIGS. 3A-3C, collectively referred to as FIG. 3, show a result of the completion of a final step of the implementation process, based on the embodiments shown in FIGS. 1A-1C, and 2A-2C, respectively, in accordance with this invention.

FIG. 3 shows the mapping after Step E of the implementation process of FIG. 5. In this example, and after considering the design constraints, the first abstract FPGA1 of FIG. 2A is realized in an technology-specific FPGA implementation 1B in FIG. 3A. However, for performance reasons the second network of FIG. 2B (FPGA2) is instead mapped entirely to standard logic (ASIC5) with a 2-bit SRAM, collectively designated as 2B, that can be set externally to determine the actual logic function performed. The previous FPGA2 function 2A is thus converted to ASIC5 logic 2B in the process. In the third network of FIG. 2C, the FPGA3 is mapped to a technology-specific FPGA and the specific functions of Decode1 and Decode2 are converted from ASIC3 and ASIC4 logic to new FPGA segments FPGA5 and FPGA6 (6B and 7B, respectively). This allows the complete logic function of FIG. 3C to be realized in an FPGA implementation, as opposed to a hybrid ASIC/FPGA embodiment.

Figure 4:
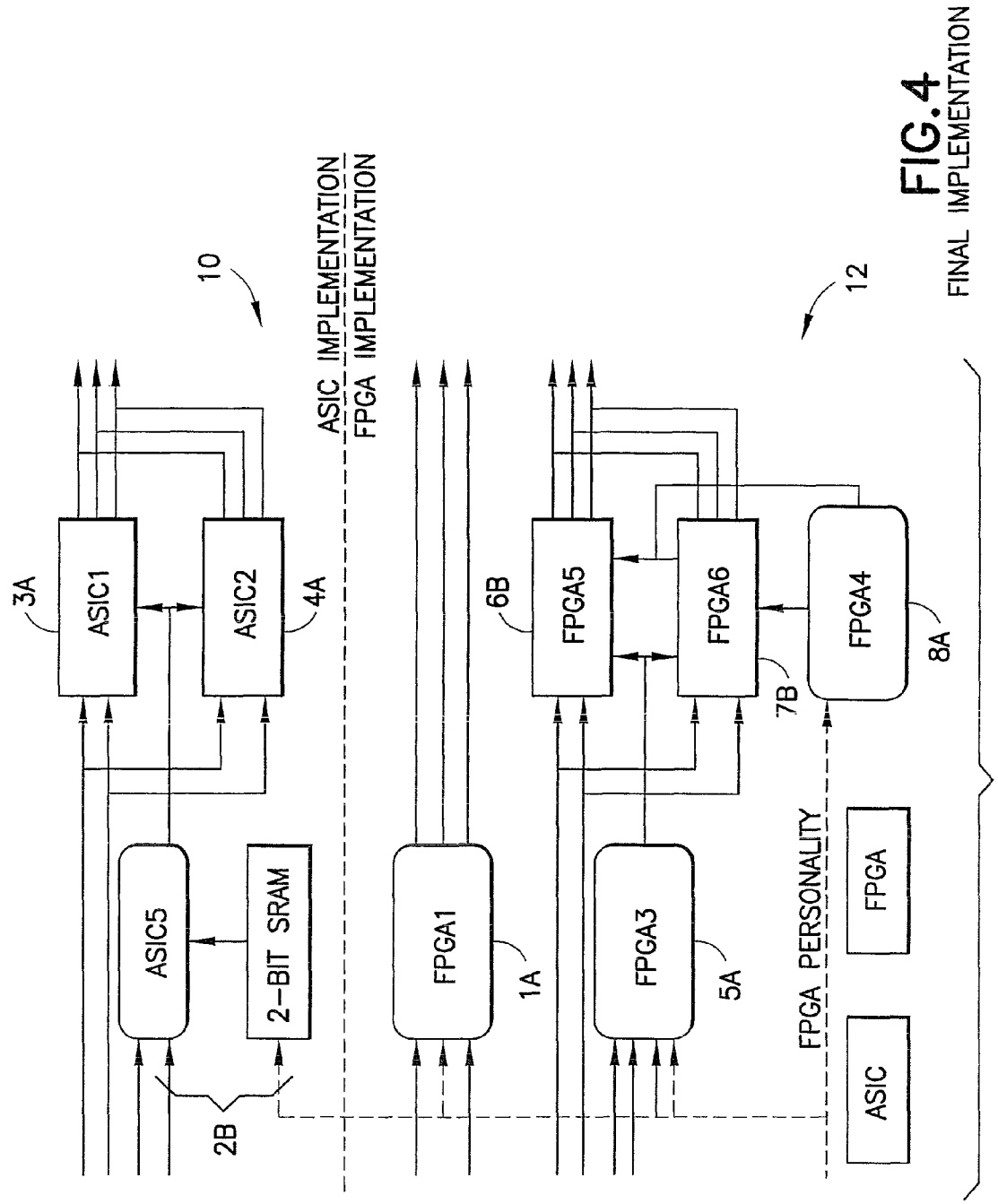
FIG. 4 shows the final result of the logic designs of FIGS. 1-3 in an IC that includes an ASIC logic implementation section and a FPGA logic implementation section, respectively.

FIG. 4 shows the final result for the manufactured chip, having an ASIC logic section 10 that contains the embodiment of FIGS. 1B, 2B and 3B, and an FPGA logic section 12 that contains the embodiments of FIGS. 1A, 1C, 2A, 2C, 3A and 3C.

Uncertain Language Extension Examples

In what follows, examples of uncertain constants, functions, and assertions are illustrated in terms of a Verilog-like specification, and are provided by the designer to reflect a high level knowledge of a design specification. Examples 1 and 2 illustrate the use of uncertain functions and constants. Examples 3 through 6 illustrate the different forms of uncertain function assertions.

EXAMPLE 1

The following module description of Decode0 specifies an uncertain function with one input a and an uncertain constant input b; one output x is defined, while two other outputs y and z of the module are completely unspecified.

```
uncertain module Decode0(a, b, x, y, z)
    input [7:0] a;
    input uncertain const [7:0] b;
    output [15:0] x, y, z;
begin
    x = a * b;
endmodule
```

EXAMPLE 2

This Example provides an illustration of a selectable function. The specification below provides an alternative description of Decode0 which uses one of its inputs as an uncertain constant b to select from three possible implementations of Decode0:

```
uncertain selectable module Decode0(a, b, x, y, z)
    input [7:0] a;
    input uncertain const [1:0] b;
    output [15:0] x, y, z;
begin
    begin case(b)
        3'b00: x = a; y = 2*a; z = a << 1;
        3'b01: x = 3*a; y = a-1; z = a << 1;
        default: x = 1'bx; y = 1'bx; z = 1'bx;
        endcase
    end
endmodule
```

Uncertain Function Assertions:

These assertions describe properties of the design entities and can be used during optimization to improve the efficiency and performance of an implementation.

EXAMPLE 3

Input Assertions describe a property or constraint on a function's inputs. Consider the Verilog description of a Decode1 component, which has two 8-bit inputs a and b, and a 16-bit output y. The assertion a!=b in the module states that values of a and b are never equal at the same time, implying that the implementation of logic a*a−3*b+2 for computing y can be simplified relying on this fact.

```
module Decode1(a, b, y);
    input [7:0] a, b;
    output [15:0] y;
    y = a*a - 3*b + 2;
    assert(a!= b)    /* input assertion */
endmodule
```

EXAMPLE 4

Output Assertions describe a property or constraint on a function's outputs. The assertion is illustrated below in the Decode2 description, establishing the "less-than" relational constraint between values of 16 module outputs. It implies that whenever this relation does not hold during computation of shift operation a<<b, the operation can have an arbitrary implementation. Thus, the assertion provides additional degree of flexibility for optimizing the implementation of a<<b.

```
module Decode2(a, b, y);
    input [7:0] a, b;
    output [15:0] y;
    y = a << b;
    assert(y[i] < y[i+1], 0 <= i < 16); /* output assertion */
endmodule
```

EXAMPLE 5

Input/Output Assertions combine and extend the previous two types by allowing properties over a function's input and outputs. The module description below refers to two components, Decode1 and Decode2, which have identical input/output connections. Together with signal s1, these connections are correlated by asserting impossible assignments <s1, a,y[0]> and <s1,y[0],y[1]>. The assertion implies that implementation of Decode1 and Decode2 can be simplified with respect to these value assignments.

```
module Select_Decoders(a, b, s1, y)
    input [7:0] a, b;
    input s1;
    output [15:0] y;
    if(s1 = = 0) y = Decode1(a, b, y)
    else y = Decode2(a, b, y);
    assert(!(s1*a*y[0] + s1*y[0]*y[1])) /* input/output assertion */
endmodule
```

EXAMPLE 6

Dependency Assertions describe signal dependencies of an uncertain function. Their utility may be illustrated using the Fn component of FIG. 1. The high level description below states conditional signal dependence in computing Fn. It asserts that, depending on the value of s2, the Fn computation depends exclusively on subsets {a, b} or {a, c} (rather than the complete set {a,b,c}). This additional information enables one to reduce the number of allocated lookup tables for implementing uncertain function Fn. As but one example of the utility of this aspect of the invention, instead of allocating resources for 21 input signals {a,b,c}, allocation of programmable logic for 14 inputs would be sufficient.

```
module SPEC_INPUT_DEPENDENCE(a, b, c, s2)
    input [7:0] a, b, c;
    input s2;
    if(s2 = = 0)
        depends(Fn) = {a, b}
    else
        depends(Fn) = {a, c} /* input signal dependence */
endmodule
```

Figure 6:
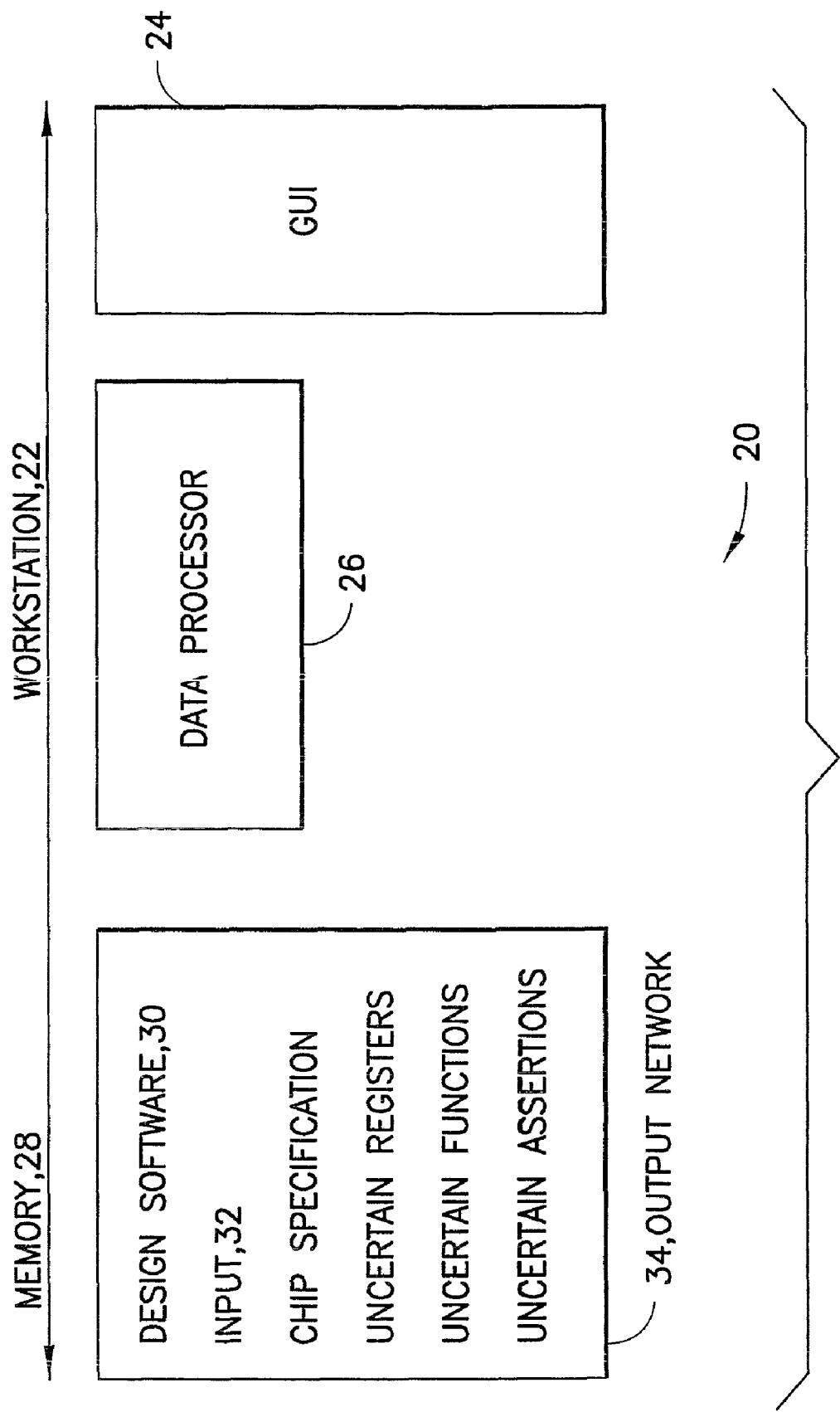
FIG. 6 is a block diagram that depicts a presently preferred computer-based system for executing the method of FIG. 5.

FIG. 6 shows a block diagram of a presently preferred computer-based system 20 for executing the method of FIG. 5. A design station, such as a computer workstation 22, includes a graphical user interface (GUI) 24, at least one data processor 26, and a memory 28. The memory 28 stores, in accordance with this invention, computer instructions and program code that implement the tasks shown in FIG. 5. Also, the memory 28 is assumed to store at least one chip design specification 30, which includes a register-transfer-level or gate-level description of the chip, and that includes input 32 comprised of at least one of the extensions referred to above to handle uncertainty, such as Uncertain Function extensions, Uncertain Register extensions and/or Uncertain Function Assertion extensions. Execution of extension program code causes the data processor 26 to operate in accordance with the method of FIG. 5 so as to be capable of implementing the logic design function(s) that were described by way of the examples of FIGS. 1-4, and the foregoing examples of the four Input, Output, Input/Output and Dependency assertions, to produce an implementation logic network (output network) 34.

The memory 28 may be implemented using any suitable computer-readable medium that is capable of storing the computer instructions or computer code. The memory 28 may be co-located with the data processor 26, or it may located remotely there from and accessed through a data communications network. The data processor 26 may also be coupled with other data processors via a network, enabling other users to also access the memory 28, providing for a collaborative chip design environment. Thus, it should be apparent that this invention is not to be construed to be limited by the specific hardware/software implementation shown in FIG. 6.

Uncertain Hardware Bring-Up

Figure 7:
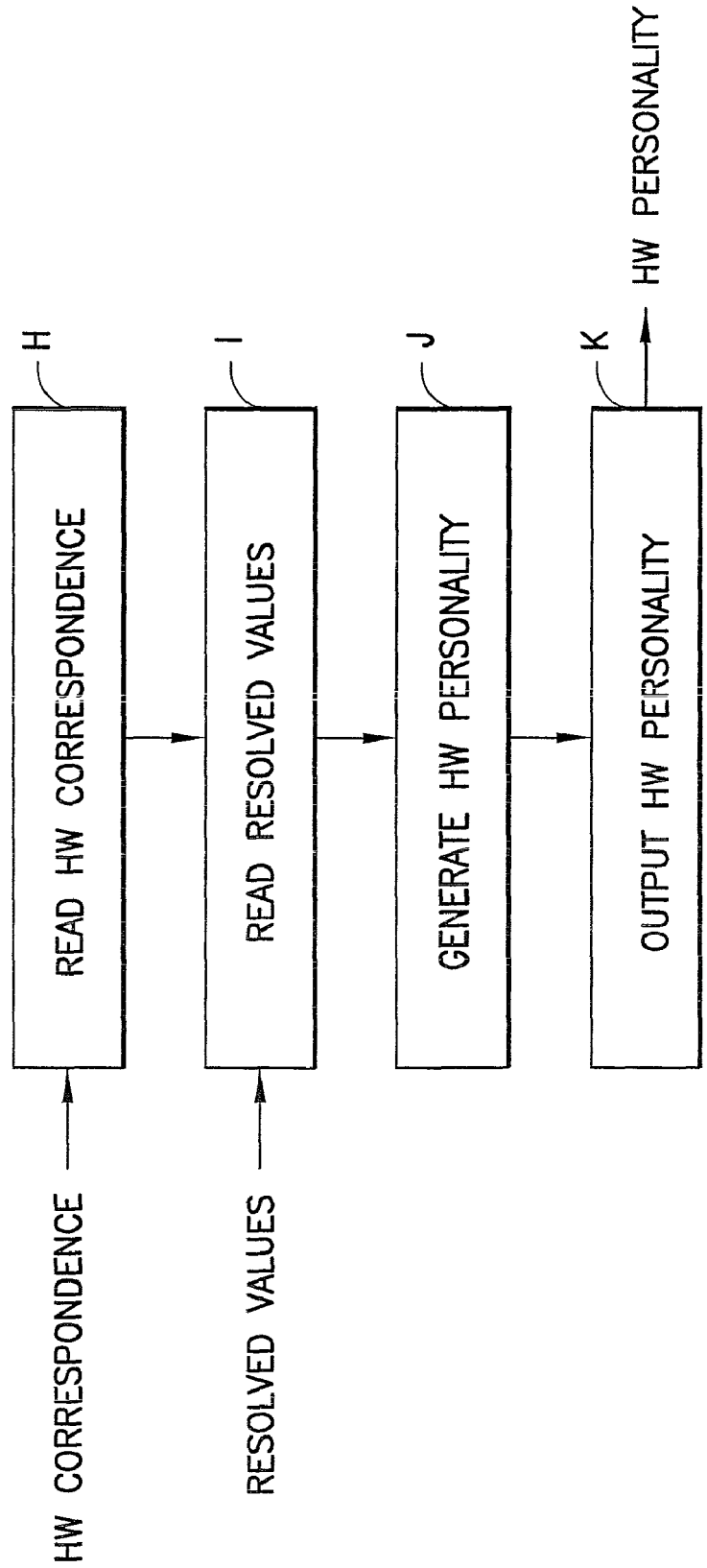
FIG. 7 is a logic flow diagram that illustrates an uncertain hardware bring-up method.

Following the implementation process described above and after manufacture, the hardware implementation needs to be personalized with specific values for all uncertain constants, functions and register lengths. This is accomplished during a Bring-up procedure that is shown in FIG. 7 and described here.

Step H: The hardware correspondence, from Step E in the Uncertain Synthesis process, is read to establish the mapping of specific values to the hardware implementation.

Step I: The specific values are read for each uncertain entity (constant, function, and register).

Step J: Using known methods of generating FPGA-like personalities, the specific constant values, function specifications and registers lengths are converted to the data needed to implement this function in the hardware implementation.

Step K; The final hardware personality produced above is output.

Figure 8:
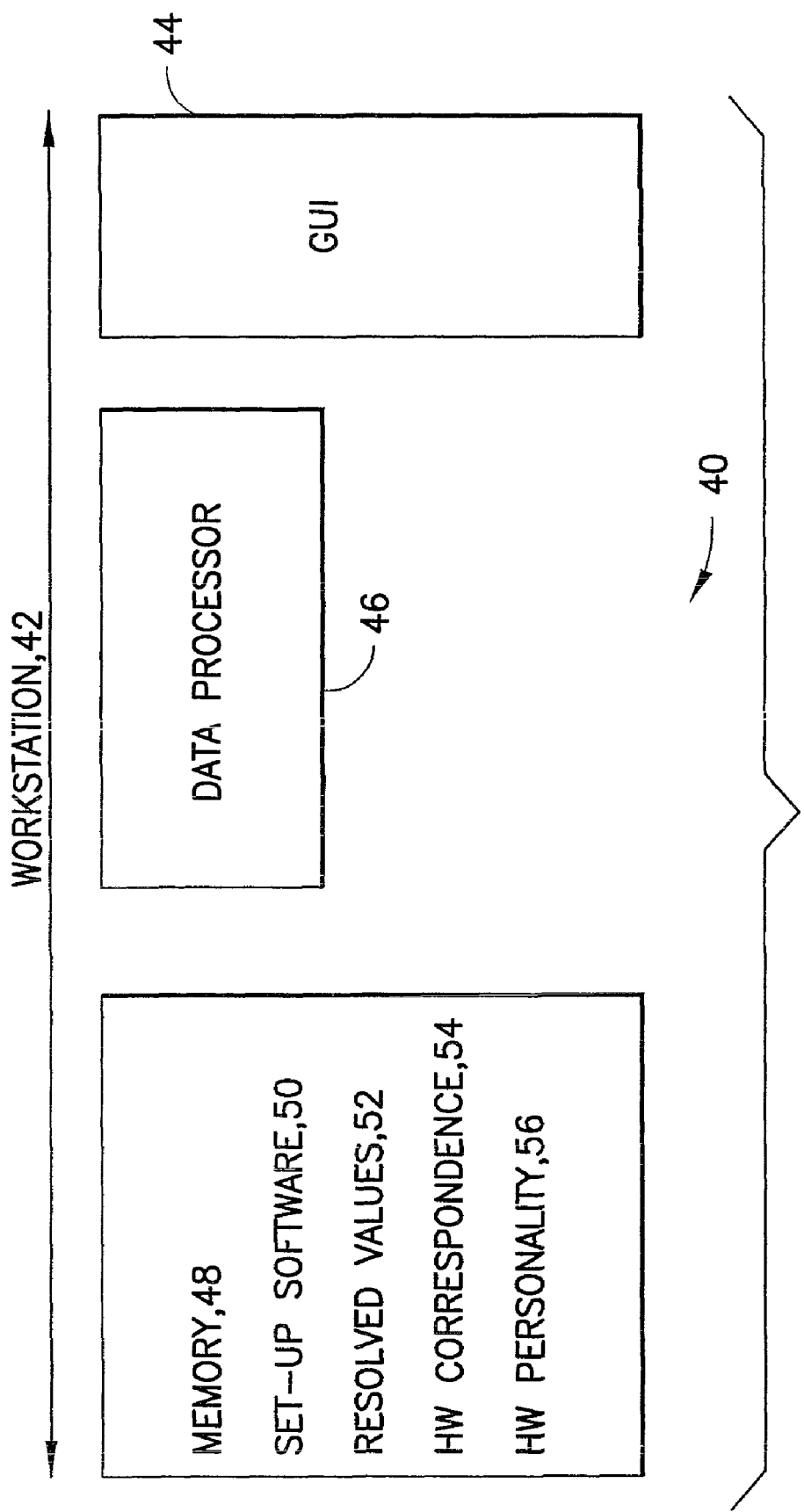
FIG. 8 is a block diagram that depicts a presently preferred computer-based system for executing the hardware bring-up method of FIG. 7.

FIG. 8 shows a block diagram of a presently preferred computer-based system 40 for executing the method of FIG. 7. A design station, such as a computer workstation 42, includes a graphical user interface (GUI) 44, at least one data processor 46, and a memory 48. The memory 48 stores, in accordance with this invention, computer instructions and program code that implement the tasks shown in FIG. 7. Also, the memory 48 is assumed to store at least one hardware correspondence 54 and at least one set of specific values for the uncertain entities 52. Execution of the Set-up program causes the data processor 46 to operate in accordance with the method of FIG. 7 so as to be capable of generating and outputting a hardware personality 56. The hardware personality 56 completes the hardware implementation by providing specific values for the uncertain entities after manufacture.

The memory 48 may be implemented using any suitable computer-readable medium that is capable of storing the computer instructions or computer code. The memory 48 may be co-located with the data processor 46, or it may located remotely therefrom and accessed through a data communications network. The data processor 46 may also be coupled with other data processors via a network, enabling other users to also access the memory 48, providing for a collaborative chip design environment. Thus, it should be apparent that this invention is not to be construed to be limited by the specific hardware/software implementation shown in FIG. 8.

It can be appreciated based on the foregoing description that the use of this invention enables the designer to specify hardware with uncertainty, to implement hardware with uncertainty, and to optimize hardware with uncertainty in order to meet certain design constraints, such as performance and/or area limitations. Uncertainty in this sense implies at least one of an Uncertain Function, an Uncertain Register, an Uncertain Constant and an Uncertain Assertion. Hardware in this sense implies, as non-limiting examples, the use of an ASIC and a FPGA, an ASIC and an SRAM (for programmability), a FPGA, an ASIC in combination with an SRAM and a FPGA, and an ASIC that uses flip-flops for programmability. Note that while certain embodiments of the invention have shown the programmability function (e.g., the memory or SRAM in FIG. 3B and in FIG. 4) as being on-chip (e.g., as a part of the ASIC), in other embodiments the programmable memory element(s) (e.g., SRAM and/or flip-flops) may be external to the chip containing the ASIC or similar or equivalent logic elements, and the output(s) of the programmable memory element(s) can be input to the chip through an appropriate number of pin(s).

In a presently preferred embodiment of the invention there is computer program code that operates to further optimize the programmable logic using the Dependency Assertions. The computer program code analyzes the specified input dependencies of each component, and then disconnects non-dependant inputs and applies minimization methods to reduce the resulting logic implementation.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other similar or equivalent logic design programs (equivalent to Verilog and/or VHDL) may be attempted by those skilled in the art, and in other embodiments additional language extensions may be devised and used. In addition, certain steps of the method (e.g., Steps A and B) may be implemented in other than the order described. Also, while described in the context of two IC technologies in one package (e.g., ASIC and FPGA), other than these two may be used, while in a further embodiment more than two IC technologies could be used. In this latter case the optimization of the final circuit design may select between the most optimum of three, or more, types of available IC technology for implementing a specific uncertain function. Furthermore, while the invention was described in the context of digital logic functions, those skilled in the art should recognize that at least some features of this invention may be applied to the design of certain analog-based circuits that are capable of using and specifying analog circuit building blocks, either alone or in combination with digital circuit blocks and gates. However, all such and similar modifications of the teachings of this invention will still fall within the scope of this invention.

Further still, some of the features of the present invention could be used to advantage without the corresponding use of other features. As such, the foregoing description should be considered as merely illustrative of the principles of the present invention, and not in limitation thereof.

What is claimed is:

1. A system for specification of an integrated circuit, comprising:
at least one data processor coupled to a user interface; and
a memory storing computer program code for directing operation of said at least one data processor for enabling a user to specify, using said user interface, an existence of uncertainty in at least one circuit, and for automatically implementing the specified uncertainty as at least one programmable circuit,
wherein said uncertainty comprises one or more uncertain parameters of at least one Uncertain Function, at least one Uncertain Register, at least one Uncertain Constant and at least one Uncertain Function Assertion of said at least one Uncertain Function,
wherein said at least one data processor is configured to optimize an implementation of the at least one programmable circuit in view of at least one predetermined performance constraint in order to simplify a circuit network obtained as a result of the automatically implementing the specified uncertainty as said at least one programmable circuit by using logic synthesis optimizations in accordance with at least one assertion.

2. A system as in claim 1, said memory further storing computer program code for optimizing an implementation of the at least one programmable circuit in view of the at least one predetermined performance constraint.

3. A system as in claim 1, where said computer program code implements the at least one Uncertain Function that is used in place of a logic function or operator, where said at least one Uncertain Function comprises at least one of an at least partly unspecified Boolean logic function with multiple inputs and multiple outputs, a selectable Boolean logic function having an input used to select one of a plurality of fully specified logic functions, and a Boolean logic function having a set of input parameters used to determine a specific logic function to be implemented.

4. A system as in claim 3, where said computer program code further implements said at least one Uncertain Function Assertion for imposing at least one constraint on the at least one Uncertain Function, said at least one Uncertain Function Assertion comprising an Input Assertion that uses a Boolean expression to specify a constraint on an input value, an Output Assertion that uses a Boolean expression to specify a constraint on an output value, an Input/Output Assertion that uses a Boolean expression to specify a constraint on a relation between input and output values and a Dependency Assertion for defining which inputs determine which outputs.

5. A system as in claim 1, where said computer program code further implements said at least one Uncertain Register as a register having a programmable size within a specified range.

6. A system as in claim 1, where said computer program code further implements said at least one Uncertain Constant having a predetermined number of bits.

7. A system as in claim 1, further comprising additional computer program code executed by the same or a different data processor for implementing a hardware bring-up operation wherein a hardware correspondence, derived from an Uncertain Synthesis process that is implemented using said computer program code and comprising said implementing the specified uncertainty as the at least one programmable circuit, is read to establish a mapping of specific values to a hardware implementation of the integrated circuit, where specific values are read for each uncertain hardware entity and are used to implement the entity in the hardware.

8. A system as in claim 7, where the hardware comprises one of: an application specific integrated circuit (ASIC) in combination with a field programmable gate array (FPGA), an ASIC in combination with a programmable memory, a FPGA, an ASIC in combination with a programmable memory and a FPGA, and an ASIC that uses flip-flops for programmability.

9. A system as in claim 7, wherein said at least one Uncertain Function is mapped to an abstract Field Programmable Gate Array implementation.

10. A system as in claim 9, wherein the abstract Field Programmable Gate Array implementation is mapped with specified inputs.

11. A system as in claim 1, wherein said implementing is a multi-step process comprising:
    creating a map of known elements and elements comprising said one or more uncertain parameters of said uncertainty;
    simplifying said map to a simplified final circuit implementation using a predetermined criterion;
    mapping said simplified final circuit implementation to a specific hardware technology; and
    further simplifying said simplified final circuit implementation to meet performance constraints.

* * * * *